(12) United States Patent
Gorbachov

(10) Patent No.: US 11,424,772 B2
(45) Date of Patent: Aug. 23, 2022

(54) RECEIVER ARCHITECTURES WITH PARAMETRIC CIRCUITS

(71) Applicant: BeRex Corporation, Seoul (KR)

(72) Inventor: Oleksandr Gorbachov, Irvine, CA (US)

(73) Assignee: BeRex, Inc., Santa Ana, CA (US)

( * ) Notice: Subject to any disclaimer, the term of this patent is extended or adjusted under 35 U.S.C. 154(b) by 311 days.

(21) Appl. No.: 16/704,792

(22) Filed: Dec. 5, 2019

(65) Prior Publication Data

US 2020/0186177 A1 Jun. 11, 2020

Related U.S. Application Data

(60) Provisional application No. 62/776,293, filed on Dec. 6, 2018.

(51) Int. Cl.
*H03F 1/26* (2006.01)
*H04B 1/04* (2006.01)
*H03F 7/04* (2006.01)
*H03G 1/00* (2006.01)

(52) U.S. Cl.
CPC ............. *H04B 1/0475* (2013.01); *H03F 1/26* (2013.01); *H03F 7/04* (2013.01); *H03G 1/0023* (2013.01); *H03F 2200/294* (2013.01); *H03F 2200/372* (2013.01)

(58) Field of Classification Search
CPC ................................ H04B 1/0475; H03F 1/26
See application file for complete search history.

(56) References Cited

U.S. PATENT DOCUMENTS

| 3,484,698 A | 12/1969 | Ruppli | |
|---|---|---|---|
| 3,699,454 A | 10/1972 | Hudspeth | |
| 5,528,585 A | 6/1996 | Cooley et al. | |
| 6,009,129 A * | 12/1999 | Kenney | H04B 1/1027 |
| | | | 375/345 |
| 10,749,472 B2 * | 8/2020 | Rocheleau | H03H 9/02393 |
| 11,128,390 B1 * | 9/2021 | Rajmohan | H04L 25/03834 |
| 2002/0050861 A1 * | 5/2002 | Nguyen | H03F 3/45197 |
| | | | 330/254 |
| 2004/0043745 A1 | 3/2004 | Najarian | |
| 2006/0071845 A1 * | 4/2006 | Stroili | G01S 7/032 |
| | | | 342/13 |

(Continued)

FOREIGN PATENT DOCUMENTS

RU 2018871 C1 8/1994
RU 2018871 C1 8/1994

(Continued)

OTHER PUBLICATIONS

Alan C. MacPherson, Parametric Amplifiers and Up-converters, US Naval Research Laboratory, NRL Report 6024, May 5, 1964.

(Continued)

*Primary Examiner* — Patricia T Nguyen
(74) *Attorney, Agent, or Firm* — Eric Karich; Karich & Associates

(57) ABSTRACT

An RF receiver circuit configuration and design is limited by conditions and frequencies to simultaneously provide steady state low-noise signal amplification, frequency down-conversion, and image signal rejection. The RF receiver circuit may be implemented as one of a CMOS single chip device or as part of an integrated system of CMOS components.

15 Claims, 7 Drawing Sheets

(56) References Cited

U.S. PATENT DOCUMENTS

| | | | |
|---|---|---|---|
| 2006/0189286 A1* | 8/2006 | Kyu | H03F 3/19 |
| | | | 455/132 |
| 2010/0048725 A2 | 2/2010 | Tas et al. | |
| 2011/0131962 A1 | 6/2011 | Toi et al. | |
| 2012/0109793 A1 | 5/2012 | Abeles | |
| 2015/0326257 A1* | 11/2015 | Xi | H03D 7/125 |
| | | | 455/114.2 |

FOREIGN PATENT DOCUMENTS

| | | |
|---|---|---|
| RU | 2329603 C2 | 7/2008 |
| RU | 2329603 C2 | 7/2008 |
| WO | WO 2010/048725 A1 | 5/2010 |
| WO | WO 2011/131962 A1 | 10/2011 |
| WO | WO 2012/109793 A1 | 8/2012 |

OTHER PUBLICATIONS

Joe L. Halpain, 3.4 Centimeter Cryogenic Parametric Amplifier System for Radio Astronomy, MS Thesis, Rice University, May 1970.

L. Liu, K. Ishikawa, T. Kuroda, Parametric Resonance Based Frequency Multiplier for Sub-GHz Radio Receiver with 0.3V Supply Voltage, IEICE Transactions on Electronics, vol. E97.

Blake Raymond Gray, Design of RF and Microwave Parametric Amplifiers and Power Up-Converters, PhD Theses, Georgia Inst. of Technology, May 2012.

Yang Xu et al., A Low-IF CMOS Simultaneous GPS Receiver Integrated in a Multimode Transceiver, IEEE 2007 Custom Integrated Circuit Conf., p. 107-110, 2007.

Guenter Heinrichs et al., Galileo/GPS Receiver Architecture for High Sensitivity Acquistion, 2014.

* cited by examiner

RECEIVER ARCHITECTURES WITH PARAMETRIC CIRCUITS

CROSS REFERENCE TO RELATED APPLICATIONS

This application for a utility patent claims the benefit of U.S. Provisional Application No. 62/776,293, filed Dec. 6, 2018.

BACKGROUND OF THE INVENTION

Field of the Invention

This invention relates generally to radio frequency (RF) receiver architectures and circuitry, and more particularly to receiver architectures utilizing parametric circuits as building blocks for low-IF and heterodyne architectures, for example, as used in mobile communications systems.

Description of Related Art

Wireless communications systems find applications in numerous contexts involving information transfer over long and short distances alike, and there exists a wide range of modalities suited to meet the particular needs of each. Chief amongst these systems with respect to popularity and deployment is the mobile or cellular phone.

A fundamental component of any wireless communications system is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Depending on the particulars of the communications modality, single or multiple antennas may be utilized. Conventional transceivers typically do not generate sufficient power or have sufficient sensitivity for reliable communications standing alone. Thus, additional conditioning of the RF signal is necessary. The circuitry between the transceiver and the antenna that provides this functionality is referred to as the front end circuit, which is understood to be comprised of a power amplifier for increased transmission power, and/or a low noise amplifier for increased reception sensitivity. Each band or operating frequency of the communications system may have a dedicated power amplifier and low noise amplifier tuned specifically to that operating frequency.

Parametric circuits have been used for some time as different blocks in radio frequency (RF) applications. Parametric diodes have been widely accepted as low noise amplifier circuits at microwave frequencies. Since semiconductor technologies evolved for use at millimeter-waves and then further to sub-millimeter waves, parametric phenomena based circuits are in rare use currently. However, there is an obvious increase of interest to parametric circuits in recent years especially for up-conversion operation. The increased interest is also based on the anti-jamming features of parametric circuit based low-noise amplifiers. Most of the circuits utilized recently were based on the Manley-Rowe architecture in which multiple signal sources and loads are placed in parallel to each other. This architecture results in a particular relationship between different frequencies in a circuit as well as in gain and noise figures. However mixed parallel and series connections among the above-mentioned chains may result in different properties of the entire parametric circuit. For instance, Manley-Rowe architecture claims down-conversion gain will always be less than 1, but the proposed inventive circuit and analysis below shows that even down-converted signals may have gain greater than 1. The proposed inventive circuit below is focused on using parametric phenomena as a building block for different low-IF and heterodyne receiver architectures. It is shown that one parametric element (i.e., a varactor diode) can be simultaneously used as a multi-functional element to provide an input low-noise amplifier, a down-conversion or up-conversion mixer, and an image-reject filter at the same time. Emerging 5G wireless systems would obviously benefit from saving semiconductor die area as well as a reduction in overall current consumption, especially at millimeter and sub-millimeter frequencies. Flexible frequency planning for the entire receiver architecture can be achieved at the same time.

The present invention fulfills these needs and provides further advantages as described in the following summary.

SUMMARY OF THE INVENTION

The present invention teaches certain benefits in construction and use which give rise to the objectives described below.

In one embodiment, the present invention provides an RF receiver circuit design limited by conditions and frequencies to simultaneously provide steady state low-noise signal amplification, frequency down-conversion, and image signal rejection. The RF receiver circuit design comprises an input resonant circuit with resonant frequency $\omega_1$ and resonant resistance R1 and an output resonant circuit with frequency $\omega_2$ and resonant resistance R2, wherein the input and output resonant circuits are connected in parallel and are additionally connected together in series via a varactor diode; a local oscillator with frequency $\omega_{pump}$ and pump signal source voltage $V_{pump} = A_{pump} \cos(\omega_{pump} t)$ applied in series with the varactor diode represented as a variable non-linear capacitance C(V) with simplified charge model with second order non-linear characteristic: $q_C = C_0 V_C + \alpha V_C^2$; a limiting design condition whereby local oscillator with frequency $\omega_{pump}$ comprises one of $\omega_{pump} = \omega_1 + \omega_2$ or $\omega_{pump} = \omega_1 - \omega_2$; a limiting design condition for a conversion gain greater than 1 at output frequency $\omega_2$ wherein: $2\alpha\omega_2 R_2 A_{pump} > 1 - \alpha^2 \omega_1 \omega_2 R_1 R_2 A_{pump}^2$; and a limiting design condition for a stable down-conversion from input frequency $\omega_1$ to output frequency $\omega_2$ wherein:

$$\frac{1}{\alpha \omega_1 R_1} * \left( \sqrt{1 + \frac{\omega_1 R_1}{\omega_2 R_2}} - 1 \right) < A_{pump} < \frac{1}{\alpha \sqrt{\omega_1 \omega_2 R_1 R_2}}.$$

Other embodiments are also described, as discussed in greater detail below.

A primary objective of the present invention is to provide an RF receiver circuit configuration having advantages not taught by the prior art.

Another objective of the present invention is to provide an RF receiver circuit configuration with a specific combination of conditions and frequencies that result in optimized and simultaneous low-noise amplification, down conversion, and image rejection.

Another objective of the invention is to provide an RF receiver circuit configuration for implementation in a CMOS single chip device or as part of an integrated system of CMOS components.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention.

DETAILED DESCRIPTION OF THE INVENTION

Figure 1:
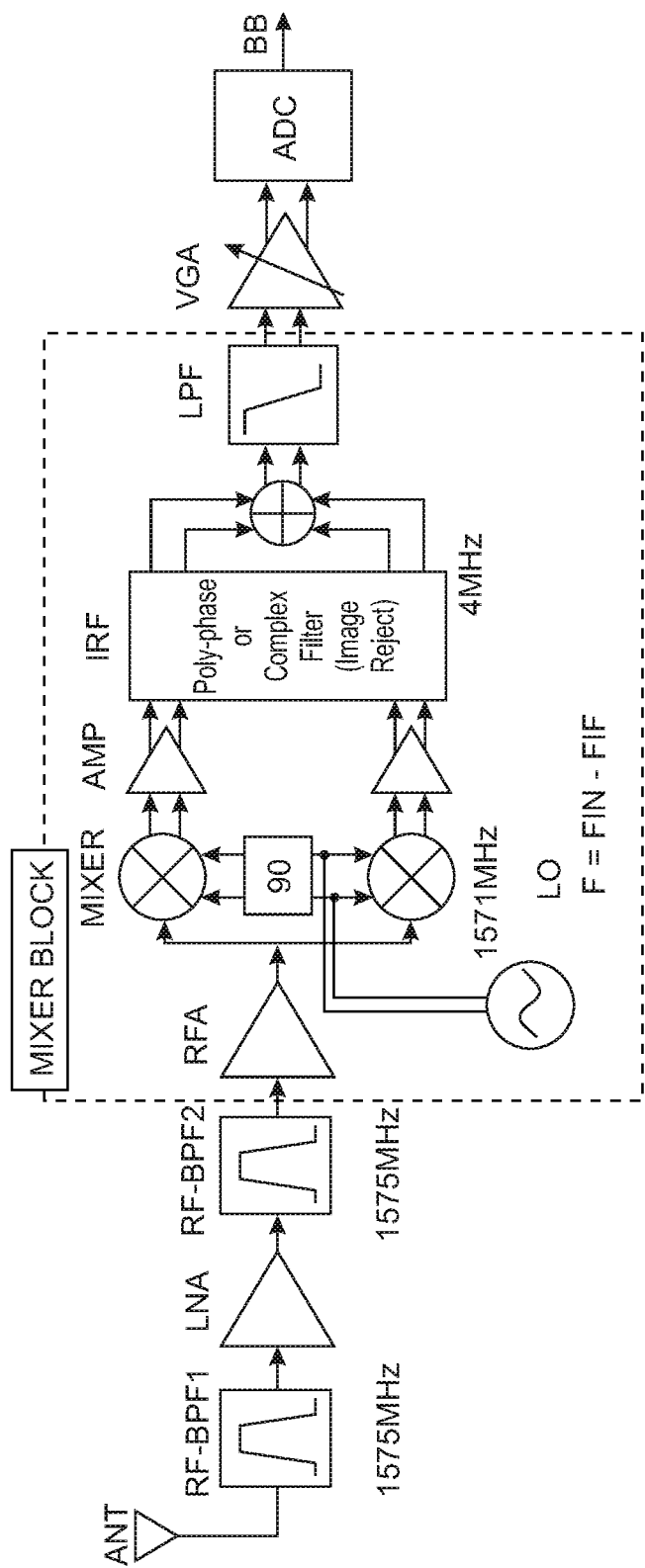
FIG. 1 is a schematic depiction of a typical low-IF radio frequency (RF) receiver architecture with mixer block found in the prior art.

Various embodiments of an RF receiver circuit configuration with a specific combination of conditions and frequencies that result in optimized and simultaneous low-noise amplification, down conversion, and image rejection are described herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Throughout the specification and claims, the following terms take the meanings explicitly associated herein, unless the context clearly dictates otherwise. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). The term "circuit" means either a single component or a multiplicity of components, either active or passive, that are coupled together to provide a desired function. The term "signal" means at least one current, voltage, or data signal. Although circuit elements may be fabricated on the back side, when reference is made to certain circuit elements residing within or formed in a substrate, this is generally accepted to mean the circuits reside on the front side of the substrate.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality.

FIG. 1 is a schematic depiction of a typical low-IF radio frequency (RF) receiver architecture with mixer block found in the prior art. It illustrates, for example, a Global Positioning System (GPS) radio frequency signal received at an antenna ANT and passing through a first band select filter RF-BPF1 and into low-noise amplifier LNA. High gain and low noise figure are requirements of an LNA for use as in a GPS receiver. RF-BPF1 must be chosen with minimal in-band insertion loss while rejecting significantly out-of-band signals. The signal typically passes through another band-pass filter RF-BPF2 at the output of LNA for additional rejection of out-of-band signals. The dual band-pass filter configuration preserves an overall low level system noise figure. RF amplifier RFA is coupled to the output of RF-BPF2 to compensate for the signal loss of the preceding filters. RFA noise figure requirements are substantially mitigated compared to LNA noise figure requirements. The amplified signal is output from RFA with low overall added noise level and rejected out-of-band parasitic signals and is applied to one port of a mixer (MIXER) while another port of mixer (MIXER) is driven by a local oscillator LO. A down-converted IF signal from MIXER output is amplified by amplifier AMP and further filtered, originally by an image-reject filter IRF, to dampen an image signal (note that filters RF-BPF1 and RF-BPF2 are typically wideband filters and they cannot reject a possible image signal coming from an antenna). Then the down-converted signal passes through low-pass filter LPF to reject possible remaining out-of-band blocking signals. The circuits between and including amplifier RFA and low-pass filter LPF may be called the MIXER BLOCK. From an output of low-pass filter LPF the down-converted IF signal is coupled to an input of a variable gain amplifier VGA which has a wide dynamic range. Finally, the down-converted IF signal from output of amplifier VGA is coupled to an analog-to-digital converter ADC from whose output a digitized signal passes on to a base-band block BB for further signal processing. Typically, the local oscillator LO frequency is chosen to be below that of the received RF signal frequency.

Many architectures of GPS receivers are known which resemble the architecture illustrated in FIG. 1. The filters, amplifier stages, and mixers may use different technologies as well as circuit configurations. Mixers providing down-conversion of a received signal are typically based on either active or passive circuitries. However, there can be improved ways for low-IF down-conversion with significantly simplified overall receiver architectures, specifically one that employs a parametric circuit.

Figure 2:
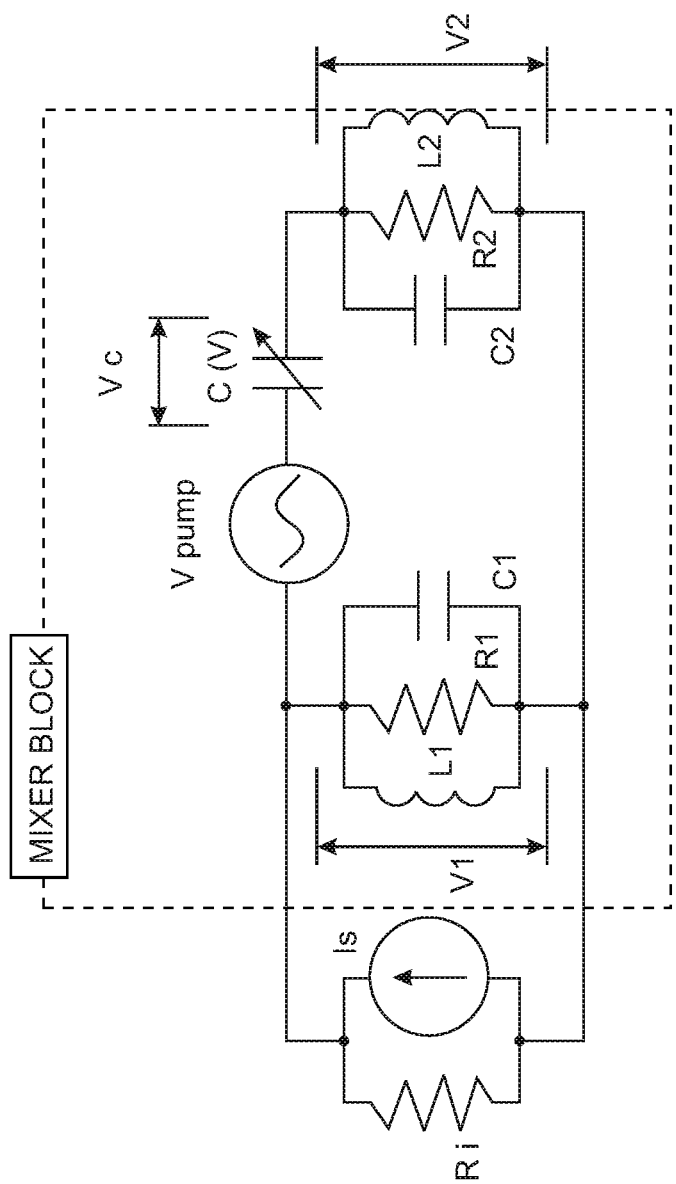
FIG. 2 is a simplified electrical schematic diagram representing an equivalent circuit of an RF receiver parametric circuit mixer block according to a first embodiment of the invention.

FIG. 2 is a simplified electrical schematic diagram representing an equivalent circuit of an RF receiver parametric circuit mixer block according to a first embodiment of the invention. The mixer block (MIXER BLOCK) comprises two parallel resonant circuits which are connected together in series via a varactor diode which is shown as a variable non-linear capacitor C(V) for simplicity. Ri represents an intrinsic resistance of an RF signal source with current Is which provides an input to the mixer block. R1 is a resonant resistance of an input RF circuit comprised of inductor L1 and capacitor C1 with resonant or center frequency $\omega_1$, while R2 is a resonant resistance of an output IF circuit comprised of inductor L2 and capacitor C2 with resonant or center frequency $\omega_2$. Both resonant circuits are connected in parallel to a useful load. Resonance occurs in a parallel RLC circuit when the total circuit current is "in-phase" with the supply voltage as the two reactive components cancel each other out. At resonance the admittance (a measure of how easily a circuit will allow a current to flow) of the circuit is at its minimum and is equal to the conductance of the circuit or specifically the reciprocal of the resistance. A pump signal source voltage Vpump is used as a local oscillator and is applied in series with the variable non-linear capacitance C(V).

Consider a simplified charge model for a varactor diode with second order non-linear characteristic:

$$q_C = C_0 V_C + \alpha V_C^2 \quad (1)$$

One can write a voltage equation for the circuit illustrated in FIG. 2:

$$V_C = V_1 + V_{pump} - V_2 \quad (2)$$

Assume current from a signal source is a harmonic signal:

$$I_S = I \cos(\omega_1 t + \psi) \quad (3)$$

Define voltage signals for an input RF, an output IF, and an LO (pump) signal as:

$$V_1 = A_1 \cos(\omega_1 t + \varphi_1) \quad (4)$$

$$V_2 = A_2 \cos(\omega_2 t + \varphi_2) \quad (5)$$

$$V_{pump} = A_{pump} \cos(\omega_{pump} t) \quad (6)$$

There are two possible steady-state solutions to achieve voltage amplitudes at the input and output circuits which are dependent on a resonant frequency choice relative to input signal frequency RF and output frequency IF:

1) Solution 1—High-Frequency Pump (Degenerate Circuit):

$$\left. \begin{array}{l} \omega_{pump} = \omega_1 + \omega_2 \\ A_1 = \dfrac{IR_1}{1 - \alpha^2 \omega_1 \omega_2 R_1 R_2 A_{pimp}^2} \\ A_2 = \dfrac{IR_1 \alpha \omega_2 R_2 A_{pump}}{1 - \alpha^2 \omega_1 \omega_2 R_1 R_2 A_{pimp}^2} \end{array} \right\} \quad (7)$$

2) Solution 2—Low-Frequency Pump (Non-Degenerate Circuit):

$$\left. \begin{array}{l} \omega_{pump} = \omega_1 - \omega_2 \\ A_1 = \dfrac{IR_1}{1 + \alpha^2 \omega_1 \omega_2 R_1 R_2 A_{pimp}^2} \\ A_2 = \dfrac{IR_1 \alpha \omega_2 R_2 A_{pump}}{1 + \alpha^2 \omega_1 \omega_2 R_1 R_2 A_{pimp}^2} \end{array} \right\} \quad (8)$$

System equations (7) and (8) are well known for parametric amplifiers with two resonant circuits. An amplified signal can be taken either from an input circuit (amplitude A1) at frequency RF or from an output circuit (amplitude A2) at frequency IF.

It is also known that power of a signal at a matched load is defined as:

$$P_s = \frac{I^2 R_i}{8} \quad (9)$$

Here Ri is an intrinsic resistance of a signal source. If one applies an RF signal to an input circuit close to resonant frequency $\omega_1$ and tunes an output circuit with resonant frequency $\omega_2$ in such a way that $\omega_{pump} \approx \omega_1 + \omega_2$, one can get a down-converted signal with simultaneous amplification at IF frequency $\omega_2$ (degenerate type circuit). However, a proper choice of circuit parameters and pump amplitude is also required.

If a signal source is conjugate matched to an input impedance of the circuit, then conversion voltage gain from an RF input signal frequency $\omega_1$ to an IF output signal frequency $\omega_2$ is:

$$G_{conv} = \frac{A_2}{V_{in}} = \frac{2\alpha \omega_2 R_2 A_{pump}}{1 - \alpha^2 \omega_1 \omega_2 R_1 R_2 A_{pump}^2} \quad (10)$$

At the same time, an RF voltage gain at signal frequency $\omega_1$ at input circuit due to degeneration is:

$$G_{RF} = \frac{A_1}{V_{in}} = \frac{2}{1 - \alpha^2 \omega_1 \omega_2 R_1 R_2 A_{pump}^2} \quad (11)$$

Equation (11) presents an important parameter for an antenna leakage estimation (i.e. LO frequency which could be close to operating frequencies and not rejected by RF-BPF1). In addition, a received signal could be amplified and transmitted back to surrounding area via the same antenna.

If one wants to have a conversion gain greater than 1 at IF frequency $\omega_2$ the following condition should be met:

$$2\alpha \omega_2 R_2 A_{pump} > 1 - \alpha^2 \omega_1 \omega_2 R_1 R_2 A_{pump}^2 \quad (12)$$

Solving the above equation and taking into account that pump amplitude can only have positive values, one can get a minimum pump voltage amplitude at which conversion gain equals to 1:

$$A_{pump}^{min}(G_{conv} = 1) = \frac{1}{\alpha \omega_1 R_1} * \left( \sqrt{1 + \frac{\omega_1 R_1}{\omega_2 R_2}} - 1 \right) \quad (13)$$

The critical pump amplitude above at which the parametric circuit becomes unstable can be defined as:

$$(A_{pump}^{crit})^2 = \frac{1}{\alpha^2 \omega_1 \omega_2 R_1 R_2} \quad (14)$$

Finally, conditions for a stable down-conversion from RF frequency $\omega_1$ to IF frequency $\omega_2$ can be defined as:

$$\frac{1}{\alpha \omega_1 R_1} * \left( \sqrt{1 + \frac{\omega_1 R_1}{\omega_2 R_2}} - 1 \right) < A_{pump} < \frac{1}{\alpha \sqrt{\omega_1 \omega_2 R_1 R_2}} \quad (15)$$

So if the LO (pump) frequency $\omega_{pump} \approx \omega_1 + \omega_2$ is higher than an input signal RF frequency $\omega_1$, at any combinations of $\omega_1$ and $\omega_2$ as well as $R_1$ and $R_2$, there is a possible solution when $G_{conv} > 1$ if one exceeds a pump voltage amplitude $A_{pump}^{min}(G_{conv}=1)$. A degenerate amplification phenomenon is pertinent to the above-noted circuit during down-conversion operation. If one applies an RF signal to an input circuit close to its resonant frequency $\omega_1$ and tunes an output circuit to satisfy the condition $\omega_{pump} \approx \omega_1 - \omega_2$, one can get a down-converted signal with simultaneous amplification or damping at an IF frequency (non-degenerate type circuit). However, a proper choice of circuit parameters and pump amplitude is required in this case as well. Also, contrary to a typical low-IF down-conversion operation with a mixer, the circuit does not have an image signal reject problem if circuit parameters are properly chosen.

For the main down-converted signal one can utilize a degenerate type of circuit, while for an image signal this circuit will behave as a non-degenerate type, "automatically" rejecting an image signal at an IF output.

For proper operation, an input RF signal should be substantially rejected at an output IF circuit. This can be easily achieved at the design stage by choosing a very large frequency separation between RF and IF signals. One can define an image reject ratio IRR from system equations (7) and (8) as a ratio of IF voltage amplitude down-converted from a useful RF signal to IF voltage amplitude down-converted from an image RF signal to the same output by the following formula:

$$IRR = \frac{\frac{IR_1 \alpha \omega_2 R_2 A_{pump}}{1 - \alpha^2 \omega_1 \omega_2 R_1 R_2 A_{pump}^2}}{\frac{IR_1 \alpha \omega_2 R_2 A_{pump}}{1 + \alpha^2 \omega_1 \omega_2 R_1 R_2 A_{pump}^2}} = \frac{1 + \alpha^2 \omega_1 \omega_2 R_1 R_2 A_{pump}^2}{1 - \alpha^2 \omega_1 \omega_2 R_1 R_2 A_{pump}^2} \quad (16)$$

The voltage amplitude at an IF output circuit is proportional to the amplitude at a RF input circuit as well as being proportional to an IF frequency.

$$A_2 = (\alpha \omega_2 R_2 A_{pump}) * A_1 \quad (17)$$

Figure 3:
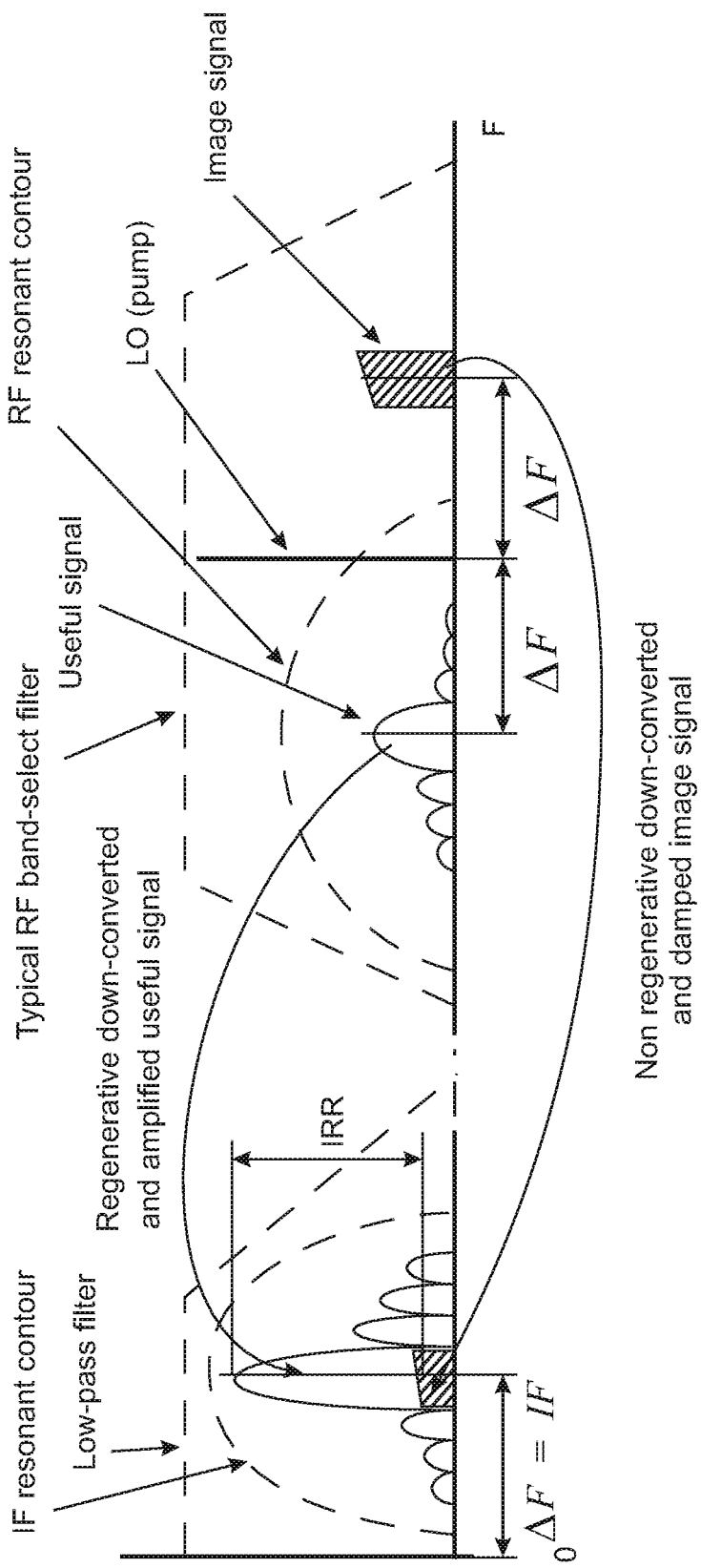
FIG. 3 is an illustration of the spectrum components in a low-IF receiver with parametric circuit and high side LO frequency as relates to an embodiment of the invention.

This can result in an IF signal linear distortion over the frequency bandwidth of a signal. A proper choice of a low-pass filter shape at the output can compensate for this distortion. This formula is valid for either degenerate or non-degenerate down-conversion to IF frequency. So, if one chooses pump (LO) frequency above a useful RF signal, one can get low-IF down-conversion with proper image reject ratio (IRR). Useful down-converted signal is linearly amplified (within a certain dynamic range of a signal) and mirrored around a center frequency while an image signal is damped without changing phase characteristics. FIG. 3 depicts the spectrum components during this operation.

A simplified charge model of a varactor diode capacitance has been considered in the above description (see formula (1)) and the non-linearity properties of the entire circuit have not been taken into account. A higher order charge model for a varactor diode should be used for full signal analysis.

Figure 4:
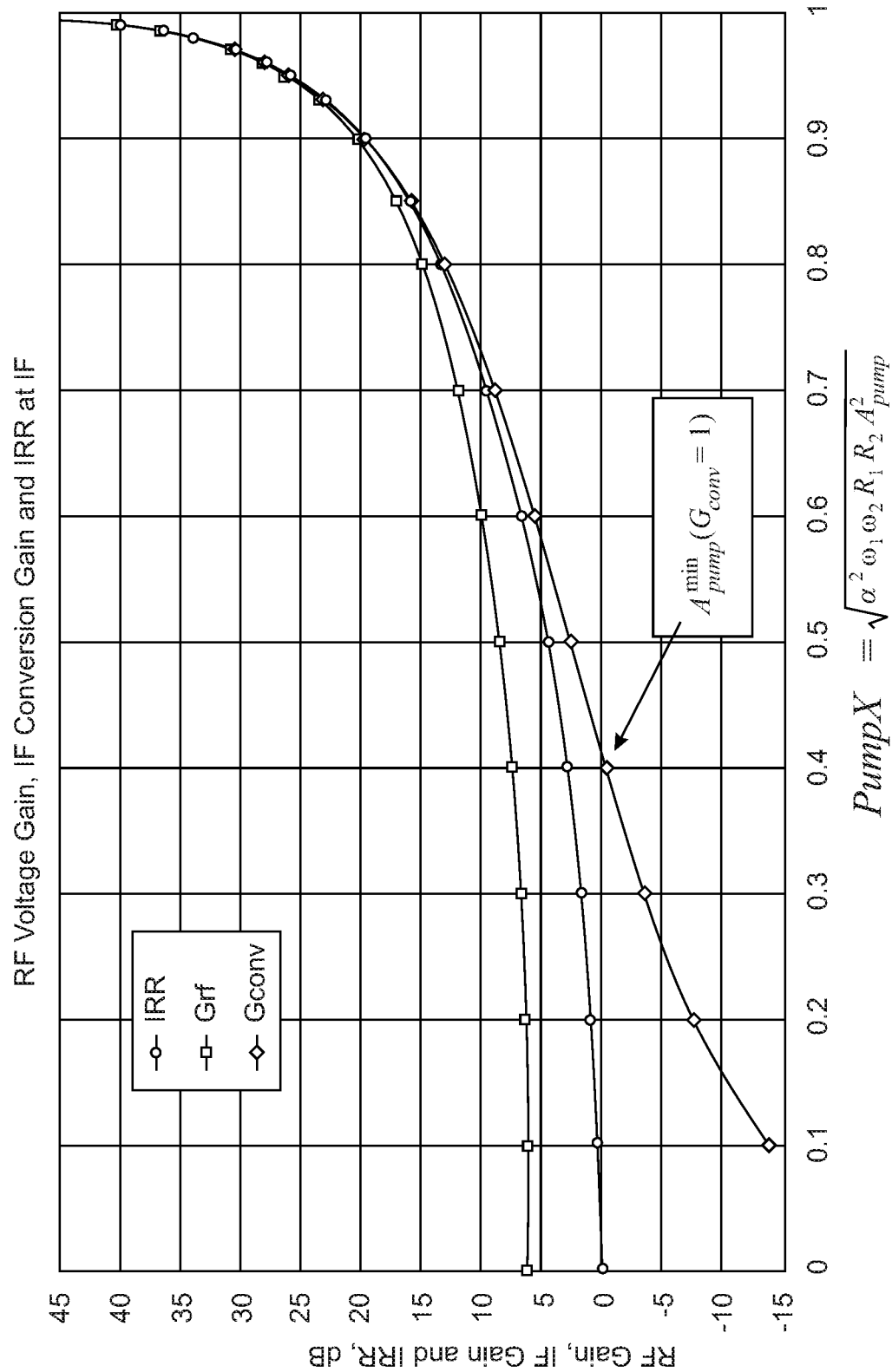
FIG. 4 is an illustration of the image rejection ratio and conversion gain for an IF signal at the output and the RF signal input gain.

If one defines a pump parameter as PumpX= $\sqrt{\alpha^2 \omega_1 \omega_2 R_1 R_2 A_{pump}^2}$ (the critical pump voltage amplitude at which circuit starts oscillating) then an image reject ratio, a conversion gain from RF to IF as well as an RF voltage gain at an input circuit due to degeneration are presented in FIG. 4 versus pump parameter PumpX. As shown in FIG. 4, a pump parameter exceeding 0.4 a voltage conversion gain from RF to IF becomes positive. A voltage conversion gain exceeds 20 dB when pump parameter PumpX is above 0.9. In this case an image reject ratio is also exceeding 20 dB. The voltage conversion gain from RF to IF with associated image reject ratio exceeds 25 dB at a pump parameter above 0.95. Stability margins over process, temperature and bias voltage variation should be verified during the design process of a real circuit.

For a degenerate mode of operation, there is a minimum voltage gain of 6 dB for a signal at RF frequency at an input circuit. RF gain at an input circuit has very similar levels with IF gain at pump parameters above 0.9. So, an input RF circuit could be used to extract an amplified signal as well (i.e. via an inductive coupling to an input RF circuit or by use of a circulator) but this topic is out of discussion in this disclosure. It is worth noting that for the circuit architecture in FIG. 2, the basic formulas as well as most of the conclusions above are well known in the literature. However, ONLY the above-chosen combination of the above-described components, conditions, and frequencies result in a low-noise amplification, down-conversion, and image rejection in a single component (a varactor diode) circuit. Such an inventive circuit may be implemented as a CMOS single chip device or as part of an integrated system of CMOS components.

Figure 5:
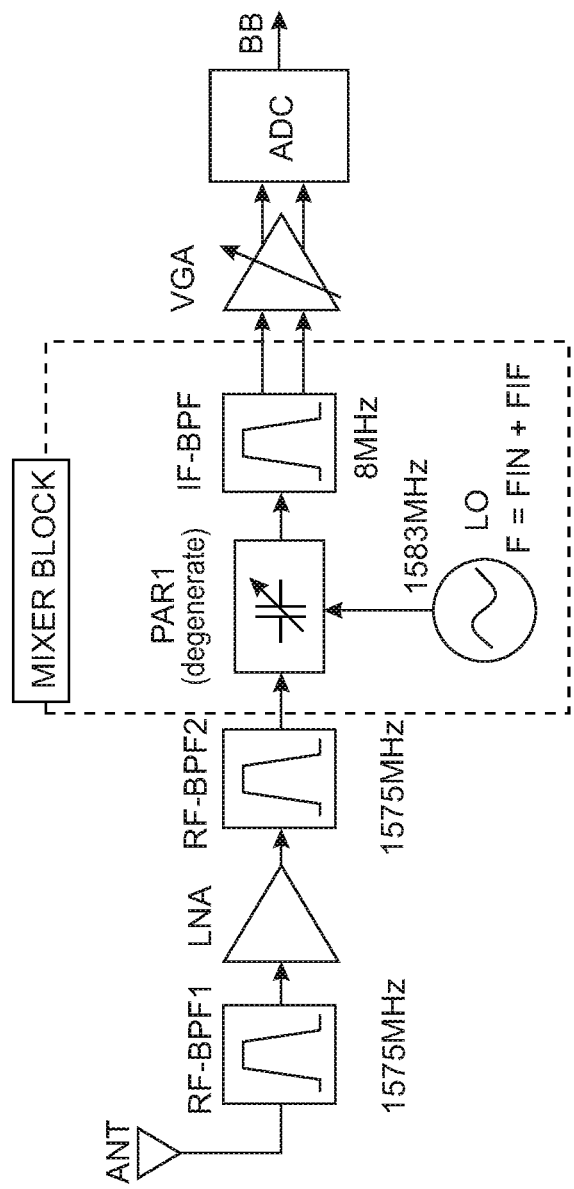
FIG. 5 is a schematic depiction of a low-IF radio frequency (RF) receiver architecture with one degenerative parametric circuit according to a first embodiment of the invention.

FIG. 5 is a schematic depiction of a low-IF radio frequency (RF) receiver architecture according to an embodiment of the invention. FIG. 5 may also represent a low-IF architecture example for a GPS or Galileo Receiver. A GPS receiver enables the Global Positioning System (GPS) which uses a constellation of 27 earth-orbiting satellites. Its purpose is to locate four or more of these satellites and determine the distance to each and use this information to deduce its own location. A Galileo Receiver is a device capable of determining a navigation solution by processing the signal broadcasted by Galileo satellites. Once the signal is acquired and tracked, the receiver application decodes the navigation message. A useful input signal FIN at 1575 MHz from an antenna is originally amplified by an LNA. In this embodiment the IF frequency FIF is chosen at 8 MHz to operate properly with both 2 MHz wide (GPS) and 4 MHz wide (Galileo) signals. The local oscillator LO frequency F is chosen according to: F=FIN+FIF=1583 MHz. A first RF filter RF-BPF1 following an antenna with center frequency of 1575 MHz filters out-of-band blocking signals. A second RF filter RF-BPF2 following the LNA output represents an RF circuit tuned for an input RF signal frequency FIN of 1575 MHz applied to a parametric diode PAR1 circuit. An output IF filter IF-BPF is tuned for a center frequency FIF at 1583−1575=8 MHz. This filter could be done either in a single-ended configuration or it can be implemented with differential chains. In this embodiment a parametric diode is operating as a degenerate amplifier of a useful RF signal and amplifies it at an IF frequency, while for an image signal it operates as a non-degenerate amplifier and damps the image signal at IF (this case was described previously with spectrum components described in FIG. 3). No additional image reject filter is required here compared to the typical architecture shown in FIG. 1. If the first filter RF-BPF1 has a narrow-band and has sharp rejection skirts (i.e. a Bulk Acoustic Wave or a Surface Acoustic Wave filter to minimize LO leakage through an antenna), then LNA and RF-BPF2 could be omitted which further simplifies overall architecture. In this case the parametric amplifier operates as an LNA and down-conversion circuitry along with image rejection. However, due to the degenerate mode of operation for a parametric circuit, the overall noise figure of a receiver may have an increased level. One could see a significant decrease in the number of circuits required for the architecture in FIG. 5 compared to the typical receiver architecture shown in FIG. 1. Thus the associated semiconductor die area as well as current consumption could be significantly decreased.

The RF receiver circuit illustrated in FIG. 5 is also disclosed wherein the frequency pair (FIN, FIF) comprises one of the pairs (1.575 GHz, 0.008 GHz), (19 GHz, 3 GHz), (28 GHz, 3 GHz), (39 GHz, 5 GHz), (66 GHz, 5 GHz), (77 GHz, 5 GHz), or (94 GHz, 5 GHz).

Figure 6:
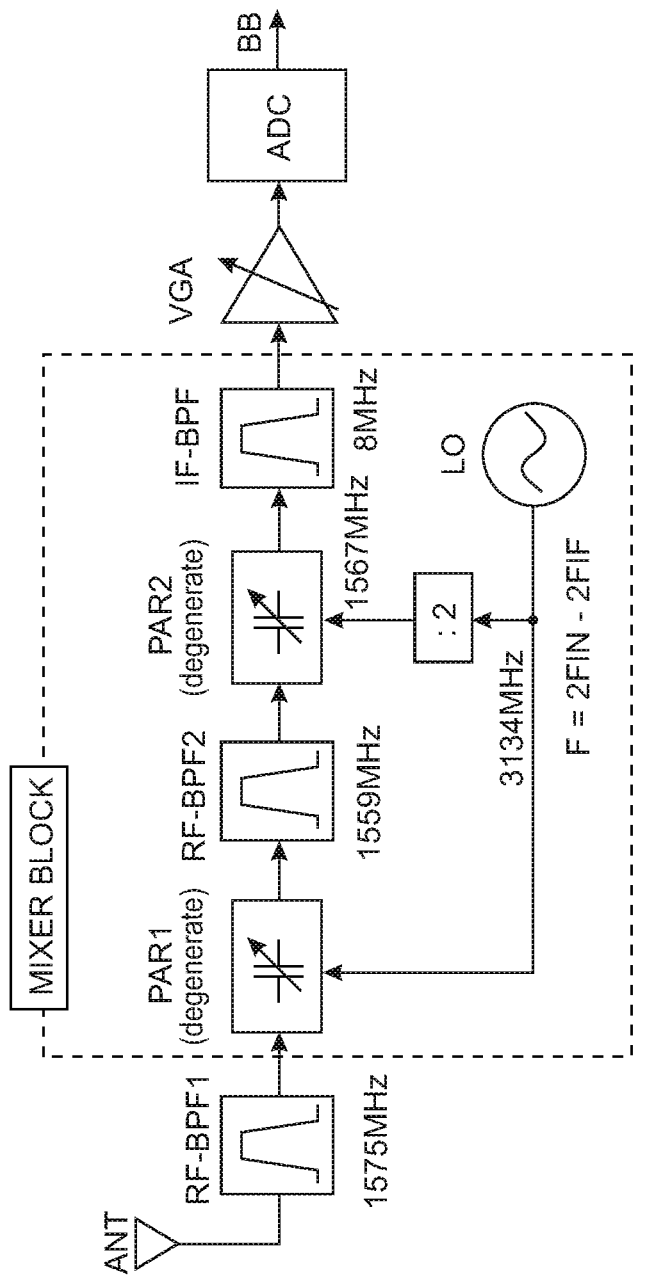
FIG. 6 is a schematic depiction of a low-IF radio frequency (RF) receiver architecture with two degenerate parametric circuits according to a second embodiment of the invention.

FIG. 6 is a schematic depiction of a low-IF radio frequency (RF) receiver architecture with two degenerate parametric circuits according to second embodiment of the invention. FIG. 6 illustrates a low-IF architecture for a GPS/Galileo receiver with two degenerate parametric circuits. An input signal from an antenna is applied to a first RF filter RF-BPF1 with center frequency FIN chosen at 1575 MHz to filter out-of-band blocking signals. In this embodiment the IF frequency FIF is chosen at 8 MHz to operate properly with both 2 MHz wide (GPS) and 4 MHz wide (Galileo) signals. A local oscillator LO frequency F is chosen such that $F=2FIN-2FIF=3134$ MHz which is applied to a first parametric circuit PAR1. Local oscillator signal leakage rejection through an antenna is greatly simplified due to the large frequency separation between the received and local oscillator signals. A second RF filter RF-BPF2 at the output of first parametric circuit PAR1 is tuned for a center frequency of F−FIN=1559 MHz. In this architecture first parametric circuit PAR1 operates as a degenerate amplifier with fairly low noise figure which converts frequency FIN from 1575 MHz to frequency F−FIN at 1559 MHz with simultaneous image rejection. Local oscillator frequency F is divided by two (F/2=1567 MHz) and is applied as a pump signal to a second parametric circuit PAR2 at the input of which the F−FIN signal at 1559 MHz is applied from the output of the first parametric circuit. The output of second parametric circuit PAR2 is loaded by IF filter IF-BPF with center frequency FIF=F/2−(F−FIN) or 1567−1559=8 MHz or equivalently FIF=FIN−F/2 or 1575−1567=8 MHz. The second parametric circuit also operates as a degenerate amplifier with down-conversion from 1559 MHz to 8 MHz with proper image rejection. A regular LNA circuit could be used at the antenna side at the front of the architecture in FIG. 6 if the noise figure of PAR1 were fairly high due to degeneration.

The RF receiver circuit illustrated in FIG. 6 is also disclosed wherein the frequency pair (FIN, FIF) comprises one of the pairs (1.575 GHz, 0.008 GHz), (19 GHz, 3 GHz), (28 GHz, 3 GHz), (39 GHz, 5 GHz), (66 GHz, 5 GHz), (77 GHz, 5 GHz), or (94 GHz, 5 GHz).

Figure 7:
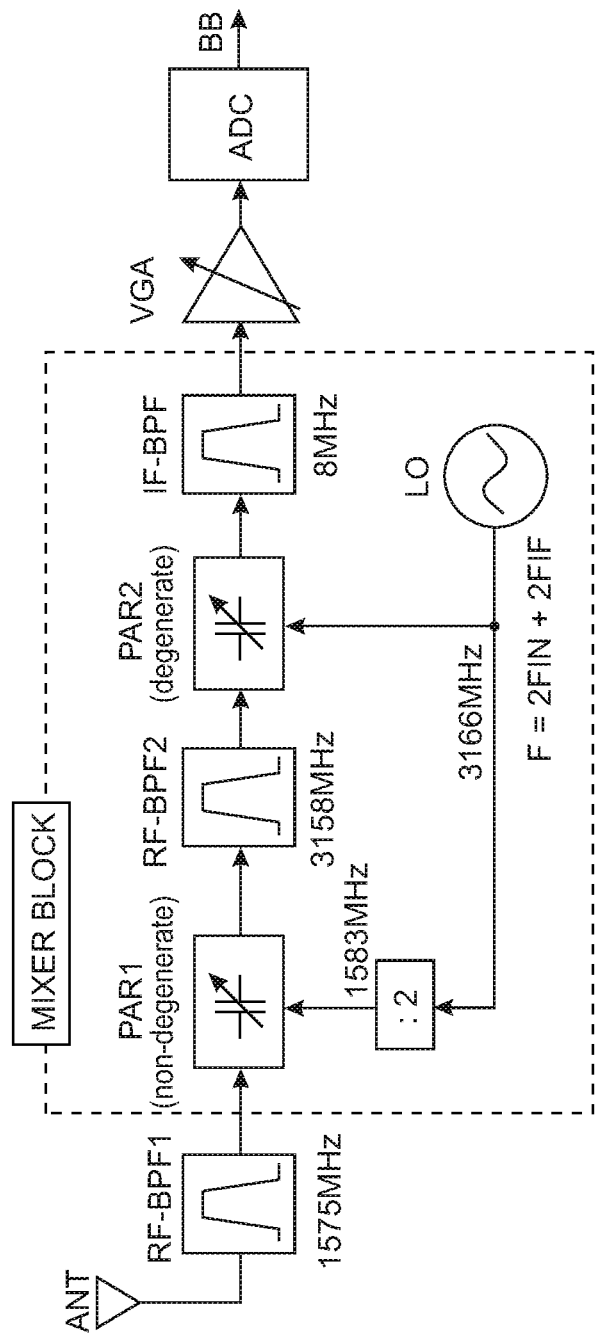
FIG. 7 is a schematic depiction of a low-IF radio frequency (RF) receiver architecture with one degenerate and one non-degenerate parametric circuit according to a third embodiment of the invention.

FIG. 7 is a schematic depiction of a low-IF radio frequency (RF) receiver architecture with one degenerate and one non-degenerate parametric circuit according to third embodiment of the invention. FIG. 7 illustrates a low-IF architecture for addressing low noise figure for the overall receiver chain of a GPS/Galileo receiver with one non-degenerate parametric circuit and one degenerate parametric circuit. An input signal from an antenna is applied to a first RF filter RF-BPF1 with center frequency FIN chosen at 1575 MHz to filter out-of-band blocking signals. In this embodiment the IF frequency FIF is chosen at 8 MHz to operate properly with both 2 MHz wide (GPS) and 4 MHz wide (Galileo) signals. A local oscillator LO frequency F is chosen such that $F=2FIN+2FIF=3166$ MHz. The local oscillator frequency is divided by two and applied as a pump frequency of F/2 or 3166/2=1583 MHz to a first parametric circuit PAR1. The second RF filter at the output of first parametric circuit RF-BPF2 is tuned for a center frequency of F−FIN 3166−8=3158 MHz. With these choices, the first parametric circuit operates as a non-degenerate amplifier with up-conversion from 1575 MHz to 3158 MHz RF signal. Rejection skirts of RF-BPF1 should take care to minimize pump signal leakage to surrounding air through an antenna. The RF signal at 3158 MHz from output of the first parametric circuit PAR1 is applied to the second parametric circuit PAR2, to which is also applied pump signal F from local oscillator LO at frequency 3166 MHz. The output of the second parametric circuit is loaded by IF filter with center frequency FIF of 8 MHz. The second parametric circuit operates as a degenerate amplifier with down-conversion from 3158 MHz to 8 MHz IF frequency with simultaneous proper image rejection. Due to the non-degenerate nature of first parametric circuit, overall noise figure of a receiver could be minimized. It must be noted that there is a distinctive difference between the choice of the pump signal amplitude for degenerate and non-degenerate circuits. There is always higher gain for both input and output contour signals (RF and IF) for a degenerate circuit with increase of a pump amplitude (see FIG. 4).

The RF receiver circuit illustrated in FIG. 7 is also disclosed wherein the frequency pair (FIN, FIF) comprises one of the pairs (1.575 GHz, 0.008 GHz), (19 GHz, 3 GHz), (28 GHz, 3 GHz), (39 GHz, 5 GHz), (66 GHz, 5 GHz), (77 GHz, 5 GHz), or (94 GHz, 5 GHz).

For a particular RF frequency received at an antenna, the choice of IF frequency could be different depending on the architecture and frequency planning for an entire receiver. The proposed solutions offer flexible frequency choices and could be beneficial while considering off-the-shelf components available in a market, especially at mm-wave frequencies. Designing new filtering and LO components may be too costly. Everything mentioned in the above is valid for all the architectures and choices of FIN, FIF pairs. Certainly the proposed architectures could be used in receiver chains facing not only the antenna side but further down the receiver chain when converting from IF signals to low-IF in heterodyne receivers at mm-waves. Proposed architectures do not reveal particular parametric circuitry as they apply universally.

The above description of illustrated examples of the present invention are not intended to be exhaustive or to be limited to the precise forms disclosed. While specific embodiments of, and examples for, the invention are described herein for illustrative purposes, various equivalent modifications are possible without departing from the broader spirit and scope of the present invention, and such alternative embodiments should be considered within the scope of the present invention. The terms used in the following claims should not be construed to limit the invention to the specific embodiments disclosed in the specification and the claims. Rather, the scope is to be determined entirely by the following claims.

What is claimed is:

1. An RF receiver circuit design limited by conditions and frequencies to simultaneously provide steady state low-noise signal amplification, frequency down-conversion and image signal rejection, the RF receiver circuit design comprising:
   an antenna coupled to an input of a first RF band select filter RF-BPF1 with center frequency FIN which is connected on an output side to an input side of a low-noise amplifier LNA;
   a second RF band select filter RF-BPF2 with center frequency FIN connected on an input side to the output of low-noise amplifier LNA and connected on an output side to an input side of a mixer block;
   a variable gain amplifier VGA coupled on an input side to an output of the mixer block and coupled on an output side to an input of an analog-to-digital converter from whose output is coupled a base-band block BB; and
   wherein the mixer block comprises a first parametric diode circuit PAR1 connected at a first input to filter RF-BPF2 and connected at a second input to a local oscillator LO with frequency F and further connected at an output to an input side of an IF filter IF-BPF with center frequency FIF.

2. The RF receiver circuit design of claim 1, wherein frequency F=FIN+FIF.

3. The RF receiver circuit design of claim 2, wherein the frequency pair (FIN, FIF) comprises one of the pairs (1.575 GHz, 0.008 GHz), (19 GHz, 3 GHz), (28 GHz, 3 GHz), (39 GHz, 5 GHz), (66 GHz, 5 GHz), (77 GHz, 5 GHz), or (94 GHz, 5 GHz).

4. The RF receiver circuit design of claim 3, wherein band select filter RF-BF1 comprises one of a BAW or SAW filter and is connected on its output side to the input side of the mixer block eliminating low-noise amplifier LNA and second band select filter RF-BPF2, and wherein parametric diode circuit PAR1 operates as a low-noise amplifier with down-conversion and image rejection.

5. The RF receiver circuit design of claim 3, implemented as one of a CMOS single chip device or as part of an integrated system of CMOS components.

6. An RF receiver circuit design limited by conditions and frequencies to simultaneously provide steady state low-noise signal amplification, frequency down-conversion and image signal rejection, the RF receiver circuit design comprising:
   an antenna coupled to an input of a first RF band select filter RF-BPF1 with center frequency FIN which is connected on an output side to an input side of a mixer block;
   a variable gain amplifier VGA coupled on an input side to an output of the mixer block and coupled on an output side to an input of an analog-to-digital converter from whose output is coupled a base-band block BB;
   wherein the mixer block comprises:
      a first parametric diode circuit PAR1 connected at a first input to filter RF-BPF1 and connected at a second input to a local oscillator LO with frequency F and further connected at an output to an input side of a second RF band select filter RF-BPF2 with center frequency F−FIN; and
      a second parametric diode circuit PAR2 connected at a first input to filter RF-BPF2 and coupled at a second input through a divide by two frequency divider to local oscillator LO and further connected at an output to an input side of an IF filter IF-BPF with center frequency FIF.

7. The RF receiver circuit design of claim 6, wherein frequency F=2FIN−2FIF.

8. The RF receiver circuit design of claim 7 wherein the frequency pair (FIN, FIF) comprises one of the pairs (1.575 GHz, 0.008 GHz), (19 GHz, 3 GHz), (28 GHz, 3 GHz), (39 GHz, 5 GHz), (66 GHz, 5 GHz), (77 GHz, 5 GHz), or (94 GHz, 5 GHz).

9. The RF receiver circuit design of claim 8, wherein:
   the first RF band select filter RF-BPF1 is connected on an output side to an input side of a low-noise amplifier LNA and the output of low-noise amplifier LNA and connected on an output side to an input side of the mixer block; and
   wherein parametric diode circuits PAR1 and PAR2 operate as a low-noise amplifier with down-conversion and image rejection.

10. The RF receiver circuit design of claim 8 implemented as one of a CMOS single chip device or as part of an integrated system of CMOS components.

11. An RF receiver circuit design limited by conditions and frequencies to simultaneously provide steady state low-noise signal amplification, frequency down-conversion and image signal rejection, the RF receiver circuit design comprising:
   an antenna coupled to an input of a first RF band select filter RF-BPF1 with center frequency FIN which is connected on an output side to an input side of a mixer block;
   a variable gain amplifier VGA coupled on an input side to an output of the mixer block and coupled on an output side to an input of an analog-to-digital converter from whose output is coupled a base-band block BB;
   wherein the mixer block comprises:
      a first parametric diode circuit PAR1 connected at a first input to filter RF-BPF1 and connected at a second input through a divide by two frequency divider to a local oscillator LO with frequency F and further connected at an output to an input side of a second RF band select filter RF-BPF2 with center frequency F−FIN; and
      a second parametric diode circuit PAR2 connected at a first input to filter RF-BPF2 and coupled at a second input to local oscillator LO with frequency F and further connected at an output to an input side of an IF filter IF-BPF with center frequency FIF.

12. The RF receiver circuit design of claim 11, wherein frequency F=2FIN+2FIF.

13. The RF receiver circuit design of claim 12, wherein the frequency pair (FIN, FIF) comprises one of the pairs (1.575 GHz, 0.008 GHz), (19 GHz, 3 GHz), (28 GHz, 3 GHz), (39 GHz, 5 GHz), (66 GHz, 5 GHz), (77 GHz, 5 GHz), or (94 GHz, 5 GHz).

14. The RF receiver circuit design of claim 13, wherein:
   the first RF band select filter RF-BPF is connected on an output side to an input side of a low-noise amplifier LNA and the output of low-noise amplifier LNA and connected on an output side to an input side of the mixer block; and wherein parametric diode circuits PAR1 and PAR2 operate as a low-noise amplifier with up-conversion and down-conversion and image rejection with low noise figure for the overall receiver chain.

15. The RF receiver circuit design of claim 13, implemented as one of a CMOS single chip device or as part of an integrated system of CMOS components.

* * * * *